United States Patent [19]
Byerley, III et al.

[11] Patent Number: 5,168,212
[45] Date of Patent: Dec. 1, 1992

[54] AUTONOMOUS ELECTRO-OPTICAL LIGHTNING IDENTIFICATION AND RANGING APPARATUS FOR, AND METHOD OF, ALERTING HUMANS AND PROTECTING EQUIPMENT

[75] Inventors: Leon G. Byerley, III; Kenneth L. Cummins; Alburt E. Pifer; Kenneth Hufnagel; William Hiscox, all of Tucson, Ariz.

[73] Assignee: Lightning Location and Protection, Inc., Tucson, Ariz.

[21] Appl. No.: 695,092

[22] Filed: May 3, 1991

[51] Int. Cl.$^5$ ................... G01R 29/08; G01W 1/00
[52] U.S. Cl. ...................................... 324/72; 340/601
[58] Field of Search ................... 324/72; 73/170 R; 340/600, 601; 250/214 RC

[56] References Cited

U.S. PATENT DOCUMENTS

| | | | |
|---|---|---|---|
| 3,715,660 | 2/1973 | Ruhnke | 324/72 |
| 4,095,221 | 6/1978 | Slocum, Jr. | 324/72 |
| 4,115,732 | 9/1978 | Krider et al. | 324/72 |
| 4,198,599 | 4/1980 | Krider et al. | 324/72 |
| 4,272,720 | 6/1981 | Lennon | 324/72 |
| 4,276,576 | 6/1981 | Uman et al. | 361/1 |
| 4,803,421 | 2/1989 | Ostrander | 324/72 |
| 4,806,851 | 2/1989 | Krider et al. | 324/72 |
| 4,996,473 | 2/1991 | Markson et al. | 324/72 |

OTHER PUBLICATIONS

EDS Transaction, American Geophysical Union vol. 71, No. 43, Oct. 23, 1990, R. Markson Abstract.
NASA Conference Publication 10058 vol. I of II Dated Apr. 16-19, 1991, Poster.
Smithsonian Jul. 1991, p. 127, Advertisement for M-10 Advanced Warning Optical Lightning Detector.
Draft Amendment of Handbook entitled: "Protection of Telecommunications Lines and Installations Against Lightning", Chapter 6, Sections 4.2, 4.2.1 and 4.2.2, CCITT Study Group V, Feb., 1991.
Publication by Kitagawa and Brook (1960), Dec.
Lightning Location and Protection, Inc's., collection of technical papers entitled: "Background Papers on the LLP Lightning Locating System and Principles of Operation", Jun. 1985.
Offer for Sale, dated May 7, 1990.

Primary Examiner—Jack B. Harvey
Assistant Examiner—Maura K. Regan
Attorney, Agent, or Firm—Victor Flores

[57] ABSTRACT

An omnidirectional lightning ranging, identification and protection system having circuits that produce no false alarms or failures to alarm, responsive to cloud to ground and cloud discharges, capable of differentiating between cloud to ground and cloud discharges insensitive to background noise, autonomous with respect to power and communications conductors for operating reliably in the presence of nearby lightning discharges, requiring no field calibration, that provides local and remote lightning rate and range data, and that provides mechanisms for automatically signalling and disconnecting electrical equipment for the purpose of lightning protection. The system has circuits that are responsive to the electric field changes produced by lightning discharges in the frequency range between 2 khz and about 200 khz and to time coincident optical radiation in the 6000 to 9000 angstroms wavelength range. The sensor has circuits for receiving and manipulating the optical radiation component, circuits for receiving and manipulating the radiation field component and electrostatic field component, and other control circuits for generating the active and inactive states and for controlling a photovoltaic solar power source, and circuits for generating digital signals that produce encoded data representing the occurrence, type and range to signal sources of natural lightning origin and circuits for communicating the composite data signal to a remote controller for further processing and manipulation.

18 Claims, 7 Drawing Sheets

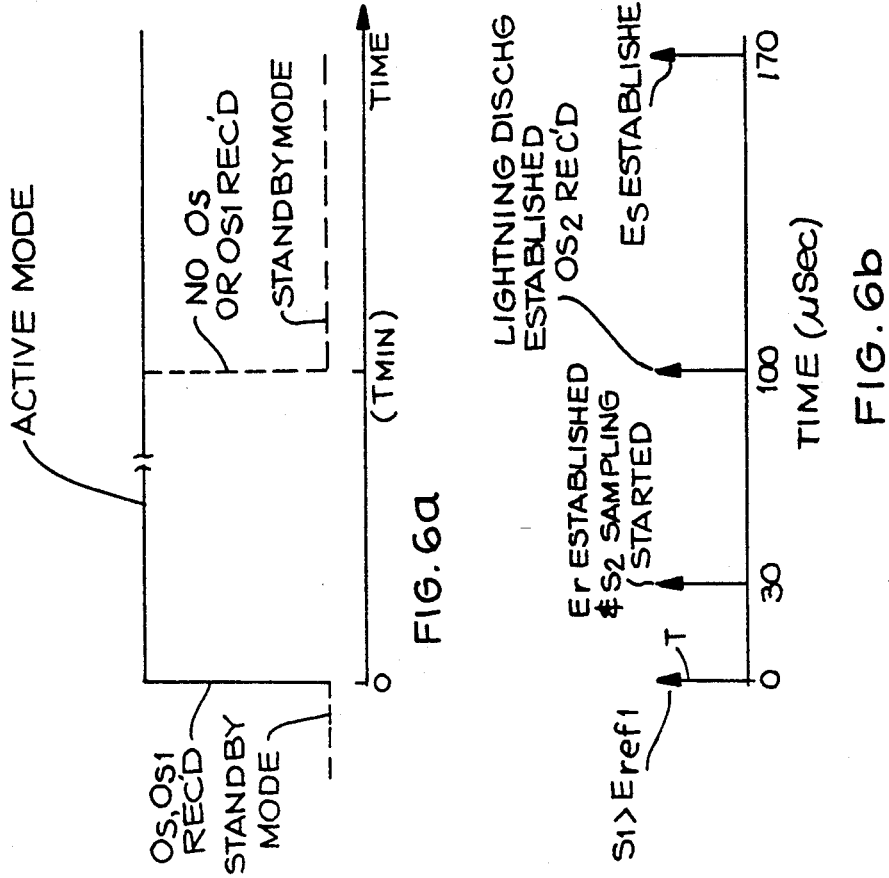
FIG. 6a
FIG. 6b
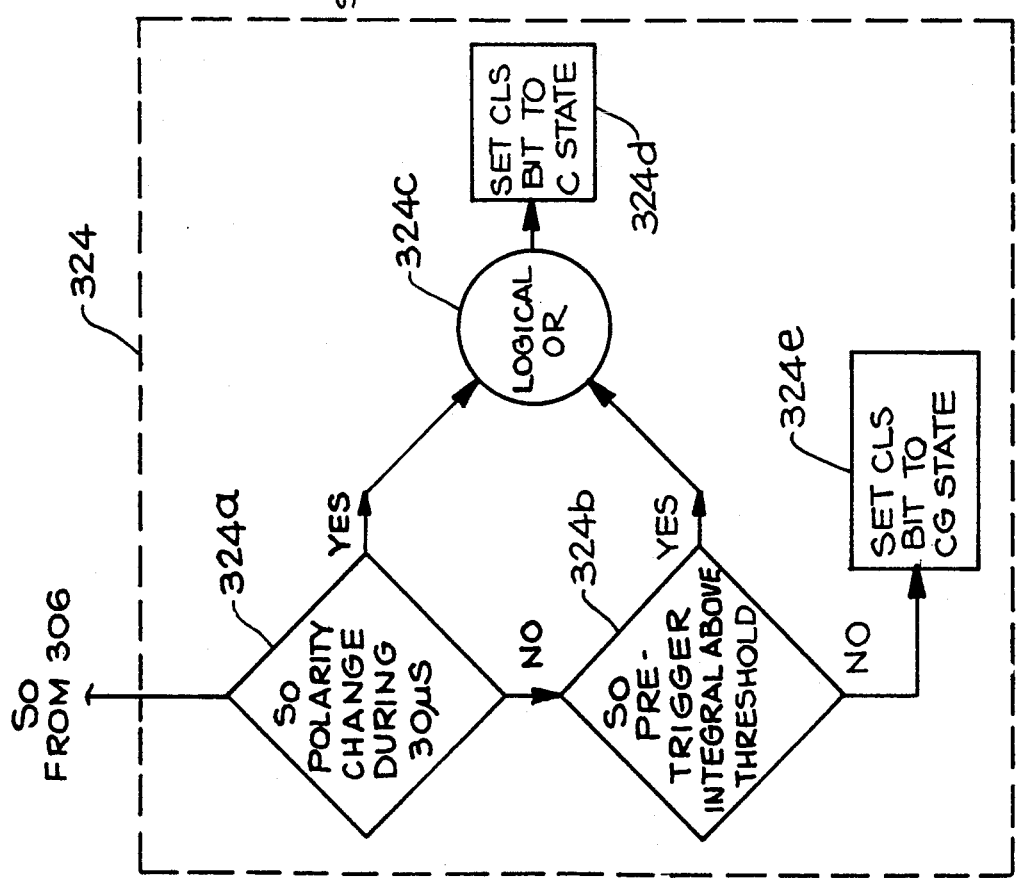
FIG. 5a

AUTONOMOUS ELECTRO-OPTICAL LIGHTNING IDENTIFICATION AND RANGING APPARATUS FOR, AND METHOD OF, ALERTING HUMANS AND PROTECTING EQUIPMENT

FIELD OF THE INVENTION

This invention relates to lightning identification, ranging and protection systems. More particularly the present invention relates to lightning identification, ranging and protection systems that utilize both electric field change and associated light pulse produced by lightning as input parameters for determining the range of the lightning as well as the type of lightning, i.e. whether a cloud type or a cloud-to-ground type.

DESCRIPTION OF THE PRIOR ART

Lightning is a natural phenomena that is of great concern to mankind and industry because of the detrimental impact on human safety, fires, and equipment failures due to AC mains power failure and conducted electrical transients. These impacts have resulted in the creation of lightning protection systems that alert, locate and even classify the type of lightning discharge. Before reviewing key prior art pertaining to lightning protection systems, a brief review of the physical activity occurring during a lightning discharge is discussed, to simplify the description of the invention.

It is known that a cloud-to-ground lightning discharge (known as a flash) is typically composed of a series of individual discharges called strokes. The first impulsive event in a cloud-to-ground lightning discharge is called the first return stroke of a flash, and is the process that follows the establishment of a channel through which charge can transfer between the cloud and ground. This channel is produced by the joining of a stepped leader from the cloud with an attachment process emanating from the ground. Return strokes radiate enormous electromagnetic fields and a large amount of light due to heating in the channel. The subsequent return strokes in a flash, typically follow the conductive channel created by the first return stroke, and are usually separated in time by 20 to 200 msec. An observer of a cloud-to-ground discharge perceives these return strokes as a flickering light source.

Prior to the advent of lightning warning systems, lightning protection consisted of lightning rods or the like for safely conducting the lightning current to ground, or arresters that employ spark gaps or other devices for conducting the currents produced by lightning to ground. These devices have been shown to be inadequate to protect electrical and electronic devices which depend on external power provided by AC or DC power mains (Draft Amendment of Handbook "Protection of Telecommunications Lines and Installations Against Lightning", Chapter 6, Sections 4.2, 4.2.1, and 4.2.2, CCITT Study Group V, Feb. 1991).

The closest prior art relating to the present invention includes the teachings of the following U.S. Patents:

U.S. Pat. No. 4,198,599 teaches that cloud-to-ground lightning can be differentiated from noise and other lightning by analysis of the broadband electric field signals in the time domain. Elements of this analysis are employed in this invention to differentiate cloud from cloud-to-ground lightning. U.S. Pat. No. 4,806,851 teaches that the distance between the lightning discharge and an electric field sensor can be accurately estimated using the ratio of the peak radiated electric field to the electrostatic field value at a fixed time delay from the radiation peak. This technique is explicitly used in this invention to obtain range information for cloud-to-ground lightning. Finally, the Publication by Kitagawa and Brook (1960), notes that the time coincidence relationship between the electric field and optical signals produced by lightning can be used as a strong means to differentiate lighting from non-lightning electric field changes. Other devices, such as those described in U.S. Pat. No. 4,276,576, provide the facility to automatically disconnect a sensitive device from power mains when thunderstorms are nearby, but are sensitive to non-lightning noise sources and have limited accuracy.

Although the prior art teaches solutions for differentiating cloud-to-ground lightning from noise and other lightning, for estimating distance between the lightning discharge and an electric field sensor, that the time coincidence relationship between the electric field and optical signals produced by lightning can be used as a strong means to differentiate lightning from non-lightning electric fields, automatically disconnecting a sensitive device from power mains when thunderstorms are nearby, the prior art does not teach devices that are capable of positively identifying both cloud-to-ground and cloud lightning, and that are insensitive to their operating environments.

Therefore a need is seen to exist for a lightning identification, ranging and protection system that employs the teachings of the prior in a manner that achieves enhanced identification, ranging and protection performance.

A need is also seen to exist for a lightning identification, ranging and protection system that employs circuitry that capitalizes on the insensitivity of the electric field ratio method to sensor location and nearby conductive structures.

A need is further seen to exist for a lightning identification, ranging and protection system that implements power and communications systems to allow autonomy from AC or DC mains, and to prevent "upset" of the system by nearby lightning.

Finally a need is seen to exist for a lightning identification, ranging and protection system that provides circuitry that improves the known circuitry for differentiating cloud from cloud-to-ground lightning.

SUMMARY OF THE INVENTION

Accordingly, the primary object of the present invention is to provide a lightning identification, ranging and protection system that employs the teachings of the prior art in a manner that achieves enhanced identification, ranging and protection performance.

Another object of the present invention is to provide a lightning identification, ranging and protection system that employs circuitry that capitalizes on the insensitivity of the electric field ratio method to sensor location and nearby conductive structures.

Still another object of the present invention is to provide a lightning identification, ranging and protection system that implements power and communications systems to allow autonomy from AC or DC mains, and to prevent "upset" of the system by nearby lightning.

Yet another object of the present invention is to provide a lightning identification, ranging and protection system that provides circuitry that improves the known circuitry for differentiating cloud from cloud-to-ground lightning.

A specific object of the present invention is to provide a lightning identification, ranging and protection system having circuit means that produce no false alarms or failures to alarm, responsive to cloud-to-ground and cloud discharges, capable of differentiating between cloud-to-ground and cloud discharges, insensitive to background noise, autonomous with respect to power and communications conductors for operating reliably in the presense of nearby lightning discharges, requiring no field calibration, that provides local and remote lightning rate and range data, and that provides mechanisms for automatically signalling and disconnecting electrical equipment for the purpose of lightning protection.

The foregoing objects are accomplished by providing an omnidirectional electric field sensor that has circuits that are responsive to the electric field changes produced by lightning discharges in the frequency range between 2 khz and about 200 khz and to time coincident optical radiation in the 6000 to 9000 angstroms wavelength range. The sensor consists of a first circuit portions for receiving and manipulating the optical radiation component, a second circuit portion for receiving and manipulating the radiation field component and electrostatic field component, and a third circuit portion for controlling events associated with the first and second circuit portions including generating the system active and inactive state signals and controlling the photovoltaic solar power source means, and a fourth circuit portion responsive to said active state signal for generating a plurality of digital signals that produce a first set of encoded data, a fifth circuit portion for generating a classification digital signal that produces a second set of encoded data, a sixth circuit portion for encoding a composite data signal comprising of the first and second set of encoded data and a seventh circuit portion for communicating the composite data signal to a remote controller for further processing and manipulation.

Therefore, to the accomplishments of the foregoing objects, the invention consists of the foregoing features hereinafter fully described and particularly pointed out in the claims, the accompanying drawings and the following disclosure describing in detail the invention, such drawings and disclosure illustrating but one of the various ways in which the invention may be practiced.

BRIEF DESCRIPTION OF THE DRAWINGS

FIG. 5a is an operational flow chart of the lightning waveform discrimination and classification block illustrated in FIG. 2.

FIG. 6a is a timing diagram illustrating the standby and active operational states of the sensor apparatus of the present invention.

FIG. 6b is a timing diagram illustrating the predetermined time intervals selected to assure the proper sampling and acceptance of only those signals produced by natural lightning discharges.

DESCRIPTION OF THE PREFERRED EMBODIMENT

Figure 1:
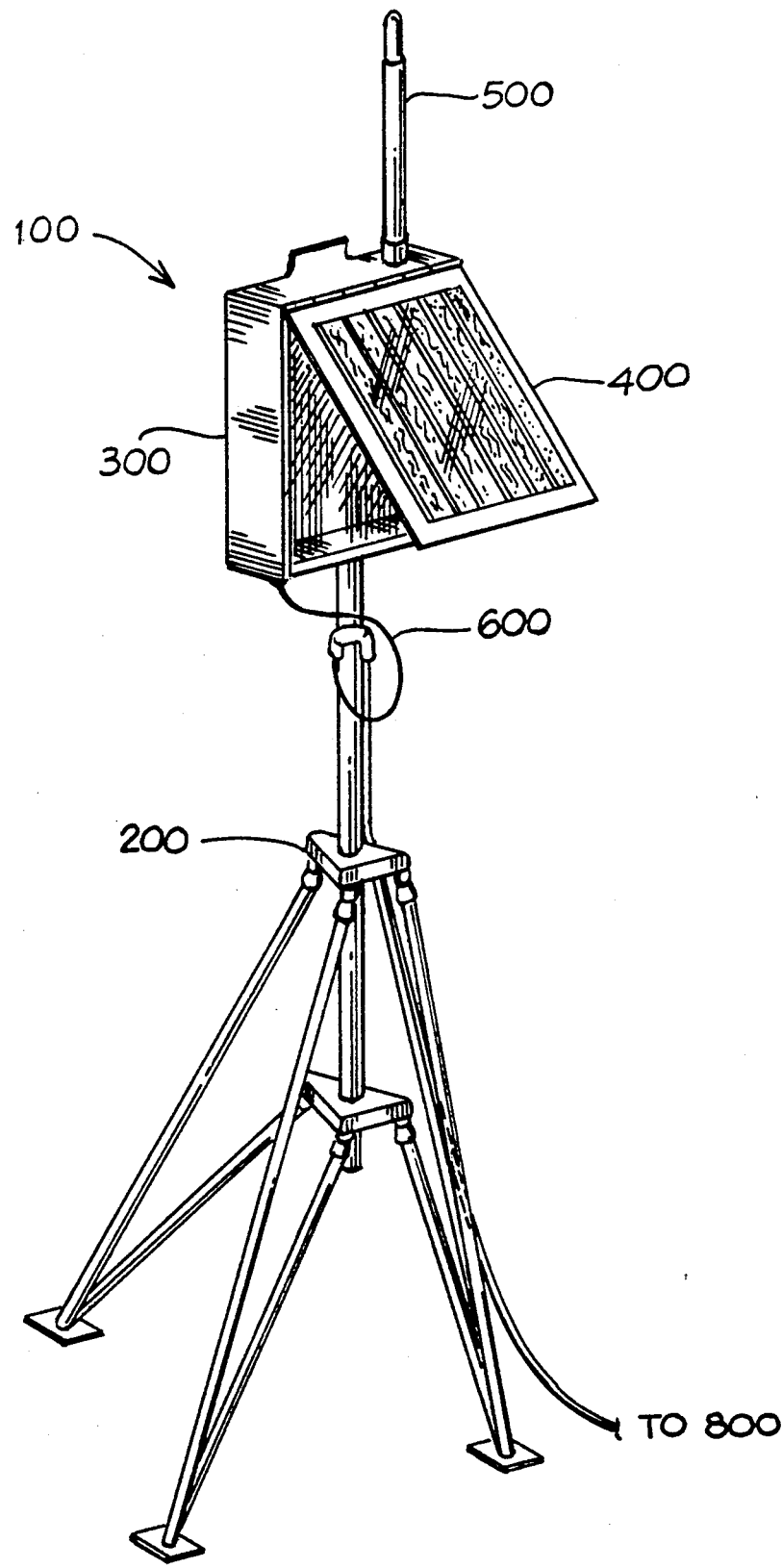
FIG. 1 is a perspective view of the sensor apparatus of the present invention.

FIG. 1 represent a mechanical embodiment of a lightning identification, ranging and protection system apparatus 100, referred to hereinafter as sensor 100. In an autonomous configuration, sensor 100 comprises a support 200 for elevating and supporting the primary signal discriminating and manipulating circuitry 300, which is powered by a solar photovoltaic power source 400, and which is responsive to electric field changes and optical pulse signals received by antenna 500 and which transmits serial data messages to a remote controller 800 via fiber optic cable 600.

Figure 1A:
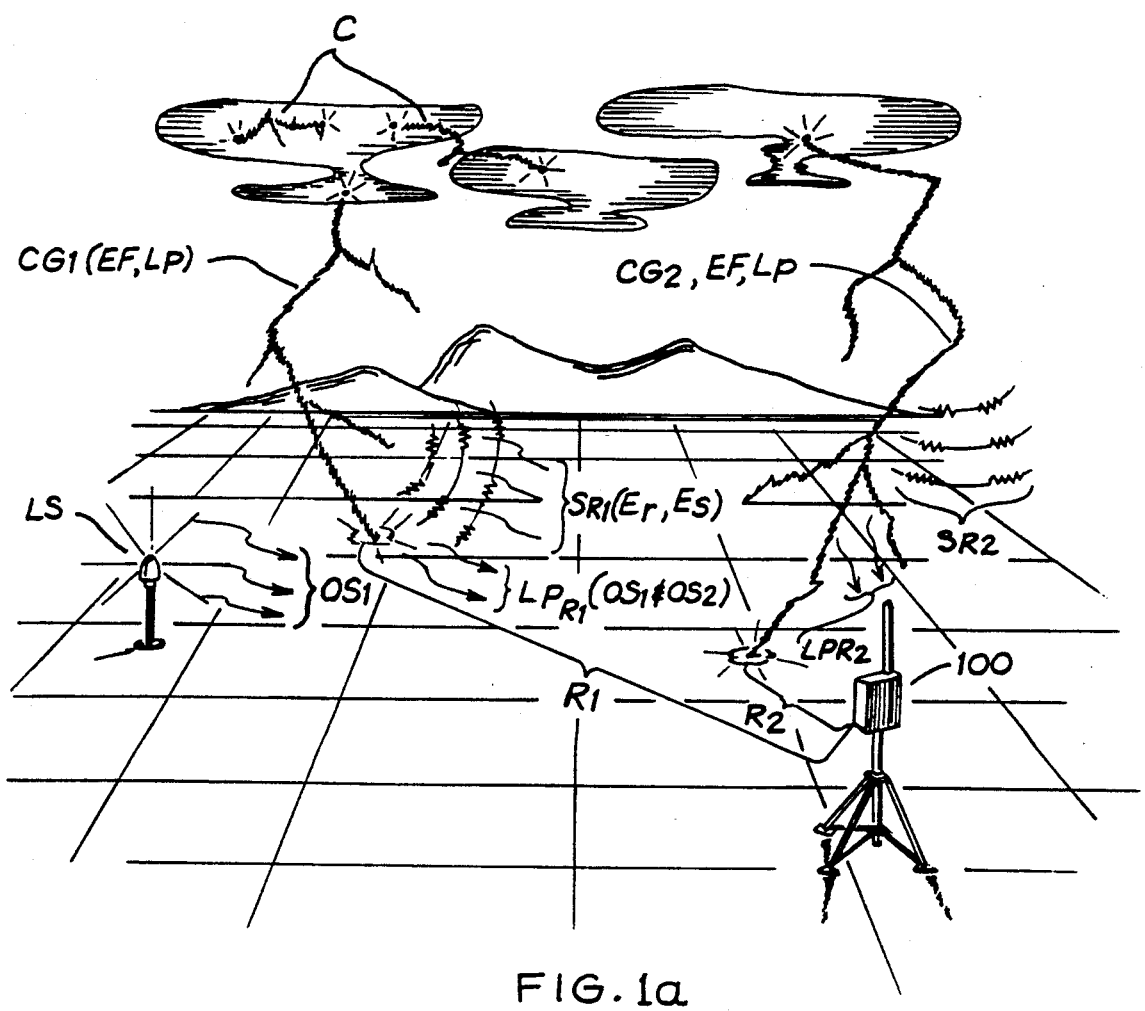
FIG. 1a illustrates the present invention in an electrical storm setting.

Referring now to FIG. 1a, where an ELECTRICAL STORM is depicted in a geographical area provided with sensor 100. For purposes of understanding the present invention, an arbitrary non-lightning light source LS is shown emitting optical signals OS, the first of which when received is of sufficient predetermined amplitude, causes sensor 100 to change from a standby power state to an active power state (see FIG. 6a) for a predetermined period of time Tmin to allow sensor 100 to fully analyze subsequent electric field changes and optical signals which may emanate from a lightning discharge as shown in FIG. 6b. Subsequent OS light pulses, although of sufficient amplitude and within the optical sensitivity range of sensor 100 are not further processed because they are highly unlikely to be time-coincident with electric field changes typical of lightning discharges. The period of the active power state Tmin is extended by the same period Tmin with every OS signal that occurs during Tmin. If no subsequent OS optical signal is received within Tmin, the sensor 100 reverts to the standby power mode at the end of Tmin. As further depicted in FIG. 1a, and as may be observed during an electrical storm, two general types of lightning discharges occur, namely lightning caused by electrical discharges between a cloud and the ground, referred to hereinafter as cloud-to-ground CG discharges and lightning caused by electrical discharges within a cloud or among clouds, referred to hereinafter as cloud C discharges. Sensor 100 is provided with discriminating circuit means for classifying the properly identified signals of lightning origin as either CG discharges or C discharges, which circuit means will be discussed below.

Still referring to FIG. 1a, sensor apparatus 100 is able to collect data for determining the range of cloud-to-ground discharges from the sensor location and to compose a flash or stroke message for transmitting to a remote controller for further processing and communicating warnings to a user of the system or for protecting sensitive electrical equipment. Accordingly, FIG. 1a also illustrates a distant cloud-to-ground discharge CG1 emitting a light pulse Lp and electric field signal EF at range R1. Light pulses Lp propagate toward sensor 100 as light pulse LpR which emits first and second optical signals OS1 and OS2, which are sensed by sensor 100. Electric field signal EF is propagated towards sensor 100 as field discharge signal SR1 containing a radiation field component Er and an electrostatic field component Es. The polarity of signals Er and Es, at certain times, plays a major role in determining the lightning classification, while the ratio Er/Es, or Es/Er depending upon the circuitry, plays a major role in the range determining aspect of sensor 100, as will be discussed below. For purposes of explaining the ranging feature, FIG. 1a depicts lightning discharge CG2, emitting light pulse Lp and electric field signal EF. Signals Lp and EF are propagated towards sensor 100 as light pulse LpR2 and field signal SR2, which consists of a radiation field component Er and an electrostatic field component Es at range R2, e.g., 5 kilometers. Sensor 100 must determine whether one or both electric field components of SR2 is too large to analyze and if so, generate an over-range signal designated OVR. If SR2 has not caused an OVR as might be the case with CG1, sensor 100 can determine that the lightning source is relatively distant, e.g. 30 kilometers, whereas if the Er/Es ratio is at unity or smaller, as would be the case with CG2, sensor 100 can determine that the lightning is relatively near, e.g. 5 kilometers.

Figure 2:
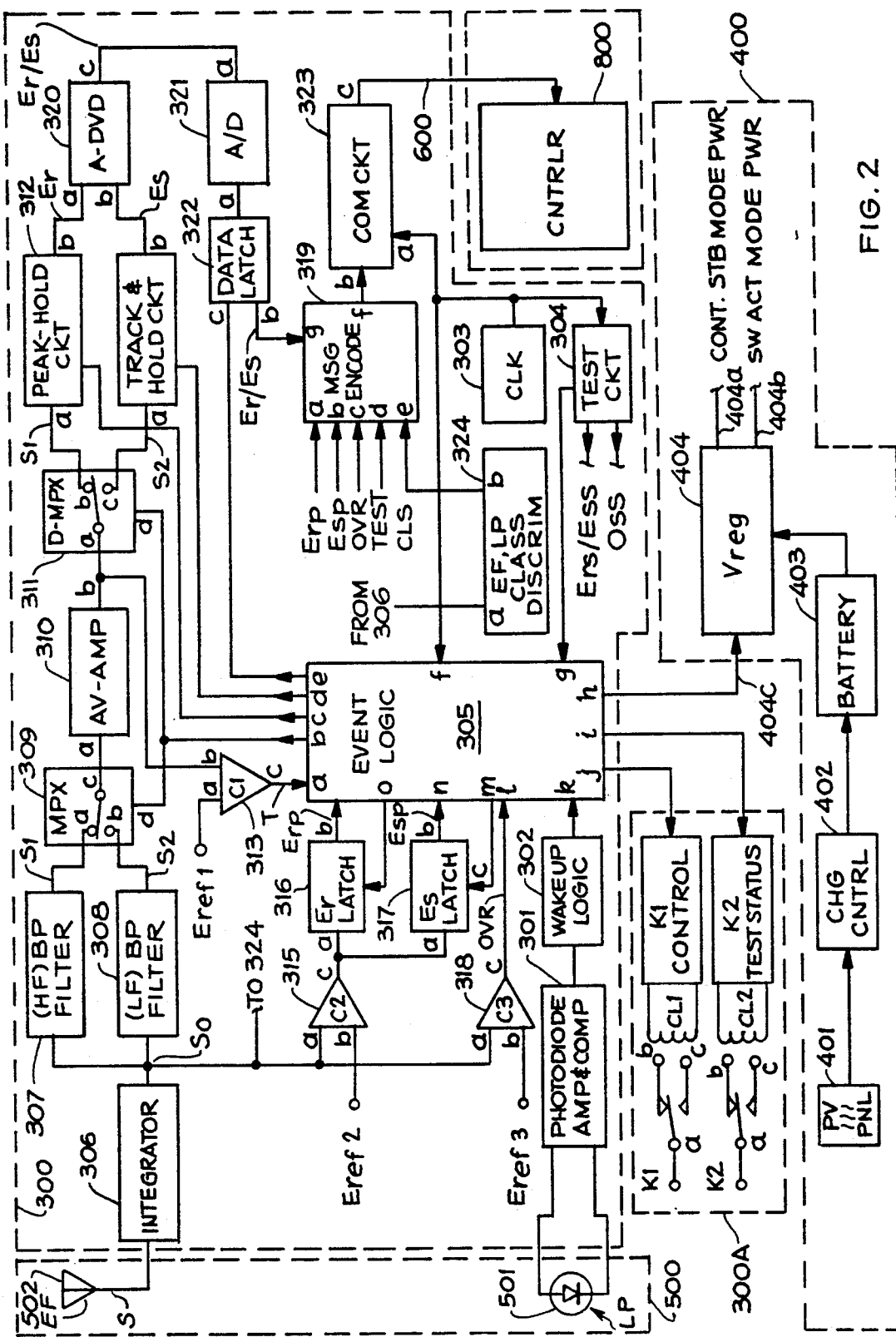
FIG. 2 is a simplified block diagram of the major circuit components enumerated in FIG. 1.

Referring now to FIG. 2, where the electromagnetic pulse identification and ranging system apparatus 100, or sensor 100, is shown in a simplified block diagram circuit representation. Antenna 500 circuitry includes a light sensor 501, for receiving a light pulse Lp, provided in the form of a photodiode, preferably a silicon photodiode, because of its superior sensitivity to light produced in the H+alpha (6563 Angstroms) and Ni(2)+ (8220 Angstroms) lines of the optical spectrum, where lightning discharges radiate with great power. The optical channel of sensor 100, comprising of photodiode 501, amplifier/comparator 301, the wakeup logic 302, clock 303, (clock 303 also enables generation of a baud rate for communication circuit 323, provides master clock pulses for test circuit 304 and event logic 305). Self-test circuit 304, is normally kept in a standby mode as is solar power source 400 consisting of solar panel array 401, a charge control circuit 402, a secondary storage battery 403 and voltage regulator 404. Power source 400 provides standby power to circuit 300 via output 404a and via output 404b during the active operation mode. The power consumption during the active mode is approximately fifty (50) times greater than during the standby power mode which difference is a great incentive to have a power conservation mode. The solar photovoltaic power conversion feature of local power source 400 factors greatly in the claim of sensor 100 to system autonomy from external power conductors. While in the standby power mode, power source 400 provides the necessary power to the optical channel comprising of photodiode 501, amplifier/comparator 301, the wakeup logic 302, clock 303, self test circuit 304. During the standby power mode, amplifier/comparator 301 is responsive to light pulse signals such as signal OS from a non-lightning source LS which is otherwise typical of lightning or a light pulse signal OS1 which in fact is from a lightning source. As indicated in FIG. 6a, the optical channel looks for the occurrence of a signal which is typical of lightning before requiring power source 400 to change to the operating active power mode. FIG. 6a shows that if a signal, such as OS, OS1, or OS2 that is determined to be typical of lightning is not received, power source 400 will remain in the standby mode. However, if OS2 is received, power source 400 will be commanded to change to active power mode via input 404c to voltage regulator 404.

Assuming that the optical channel has determined that a lightning discharge has occurred and has caused power source 400 to be in an active power mode to provide power to the previously unpowered portions of circuit 300, then, circuit 300's analyzing task can begin. The task includes utilizing antenna 500, which includes a broadband electric field sensor 502 for receiving an electric field pulse EF. Since field pulse EF is expected to be a low-frequency broadband signal which is characteristic of electric field changes that lightning discharges produce, sensor 502 is a broadband antenna provided in the form of a conductor, whose gain for vertical electric field changes is determined by the area, shape and elevation of the conductor above the earth. The electric field pulse EF induces a time varying charge onto the conductor that produces a low level time varying signal S that is provided to integrator 306 in the primary circuit 300. Integrator 306 converts derivative signal S to signal S0, in the time domain, having a waveform that is representative of the vertical electric field change EF, that is the result of the vertical rate of change of current in the discharge channel, regardless of whether the discharge is a CG discharge or C discharge. Since S0 is a voltage representation in the time domain of the broadband electric field change, S0 contains a high frequency radiation field component Er and a low frequency electrostatic field component Es. In analyzing S0, the bandwidth must be limited at low frequencies to filter 50Hz and 60 hz power line radiations that may be included in S0 and to filter out high frequency signals that may emanate from commercial AM radio transmitters. Thus, a low-pass broadband filter 308 is provided having a pass band of typically 5 kHz to extract signal amplitude information, designated signal S2, from S0 pertaining to the electrostatic field Es, while high-pass broadband filter 307 is provided having a pass band of typically 100kHz to extract signal amplitude information, designated S1, from S0 pertaining to the radiation field Er.

Signals S1 and S2 are then directed to multiplexer 309, positions "a" and "b" for being selectively processed into input "a" of absolute value amplifier 310 upon receiving an appropriate logic command signal from event logic 305, output "b" into position "d" of multiplexer 309. Initially, multiplexer 309 is set to transfer signal S1 from output "c" into input "a" of absolute value amplifier 310 which removes the polarity information associated with the signal. The absolute value of signals S1 and S2, from output "b" of multiplexer 310, are sequentially inputted to input "a" of de-multiplexer 311 with S1 being first directed and to input "b" of enable comparator 313, also denoted as C1. Thus, as S1 is processed, de-multiplexer 311 will direct the signal via output "b" into input "a" of peak hold circuit 312. Circuit 312 holds the largest voltage peak associated with S1 that occurs while active and until discharged via a logic command signal from event logic control circuit 305, output "c". If S2 is the signal to be processed, multiplexer 309 and de-multiplexer 311 will be instructed at inputs "d" and "d", respectively, via a command signal from event logic 305, output "b", to switch multiplexer 309 from position "a" to position "b" and to simultaneously switch demultiplexer 311 from output "b" to output "c" which is connected to input "a" of a track-and-hold circuit 314. Circuit 314 will continually track the absolute amplitude of S2 until a command signal is received from event logic 305, output "d", to hold the amplitude value of S2 at that the time the command signal is received.

As noted above, during initial periods of operation, signal S1 is inputted to input "b" of comparator C1 for being compared against a reference voltage Eref1 maintained at input "a" of comparator C1. Threshold value Eref1 is set such that when exceeded, the value of S1 is indicative of a radiation field component Er produced by a lightning discharge within approximately 30 km of the sensor. If S1 has an absolute amplitude voltage value that exceeds Eref1, then a series of events at input "a" of event logic 305 will be triggered by an output trigger signal T from comparator C1, output "c". By example, and referring to FIG. 6b, the first event triggered by signal T is the setting of a sampling period, comprising firing of single-shot timer for 30 microseconds, for sampling and establishing the amplitude of S2. At the end of the 30 microseconds, the event logic 305 causes multiplexer 309 to change to process signal S2 via absolute value amplifier 310, de-multiplexer 311 to track-and-hold circuit 314. The peak voltage sampled during the 30 microseconds is available as voltage output Er representing the radiation field component of S0 whose amplitude and rise time meet the lightning radiation field criteria of interest.

Before discussing the sampling of S2, another event that is triggered by trigger T from comparator C1 is the start of a timer that is active for 100 microseconds to allow the optical channel to check for the occurrence of a light pulse characteristic of lightning for 100 microseconds after trigger T. If the optical channel informs event logic 305 that such a light pulse has occurred within 100 microseconds of trigger T, then event logic 305 is conditioned to operate under the pretense that a lightning discharge has occurred and that a flash message, or composite encoded message will be transmitted to the controller 800. The system is reset to the active state waiting for the next trigger T. The classification data regarding the type of lightning discharge, i.e. CG discharge or C discharge is determined during the 100 microsecond lapse time. However, if the optical channel does not receive a light pulse typical of lightning within 100 microseconds of trigger T, then the event logic 305 will cause a reset of circuit 300 to the active mode of operation until another electric field change impulse causes trigger T. By examining S0 for Er during 30 microseconds after trigger T and looking for a light pulse OS2 which is typical of lightning within 100 microseconds, the range sensitivity of sensor 100 for lightning is exemplified, i.e. since optical power falls off at the rate of 1/range squared) rather than 1/range, distant lightning will not activate the system.

Assuming that the system is in the active power mode and that a trigger T has occurred, then also by example, the tracking of S2 continues for a period of 170 microseconds after the trigger signal T is received by event logic 305. At 170 microseconds after T, the amplitude value of S2 is held by circuit 314 and available as voltage output Es representing the electrostatic field change value. Thus, after the 170 microsecond sampling period, Er from output "b" of circuit 312 is inputted to input "a" of analog divider 320. Similarly, Es from output "b" of circuit 314 is inputted to input "b" of divider 320. Divider circuit 320 outputs the analog ratio Er/Es at output "c" which is converted to a digital ratio Er/Es via A/D converter 321, output "a", for input and storage into data latch 322 which is controlled by event logic 305 output "e". The digital representation of Er/Es is outputed from latch 322, output "b" for being encoding by message encoder 319 as part of a composite encoded message to be asynchronously communicated by communications circuit 323 to a remote controller 800 via a fiber optic cable link 600. Recall that if the Er/Es ratio is large, the lightning discharge is relatively distant, whereas if the ratio is at unity or smaller, the lightning discharge is relatively closer. The ratio Er/Es is a measure of the relative electric field change, abbreviated REFC. Also, the validity of the ratio Er/Es for determining the range of a cloud to ground discharge, which ratio is an absolute value, requires that the respective polarities of Er and Es be the same, see discussion of Erp and Esp below for additional details.

As seen by inspecting inputs, "a","b","c","d" and "e" to message encoder 319, other digital inputs are needed to complete the composite message, namely the polarity of Er at time of T, designated Erp, the polarity information of Es at 170 microseconds after T, designated Esp, whether S0 is overrange, designated OVR, whether the manipulation of circuit 300 is under controlled test conditions, generating simulated optical signal OSS and electric field signals Ers and Ess, designated as TEST, and the classification of the lightning discharge that generated S0 as being CG discharge or C discharge, designated CLS.

Erp is established at the time of trigger signal T, by using the output of a polarity comparator 315, also designated C2, with a fixed threshold Eref2, whose output level is stored in latch 316 set at the 30 microsecond time. Similarly, Esp is established at the time of establishing Es, i.e. 170 microseconds after trigger signal T, by using the output level of polarity comparator C2 stored in latch 317 set at the 170 microsecond time period. Both latches 316 and 317 are controlled by event logic 305. It should be noted that at certain times of interest, CG discharges have the same polarity of radiation field change as electrostatic field change, accordingly, in order to use the digital ratio Er/Es information for determining the range, R1 or R2 for example, the controller 800 must verify that Erp is the same as Esp.

The OVR information is determined by overrange comparator 318, also designated C3, having a threshold voltage Eref3 representing that the signal S0 is too large to process and that amplifier information in circuits 312 and 314 is not to be relied upon due to them being driven into saturation. This OVR condition is typical of overhead or nearby lightning that generate S0 as a signal too large to process.

The TEST information received by encoder 319 is for purposes of informing controller 800 whether the other information, i.e. Er/Es, Erp, etc., are simulated light pulse signals OSS or simulated electric field discharge signal Ers or Ess, which tester 304 is capable of generating. The TEST serial data message is used to signal the remote controller that the sensor 100 is in a state of good health.

The lightning discharge classification information CLS is obtained from discriminator circuitry 324, which utilizes signal S0 from integrator 306 for determining whether EF was from a cloud discharge or from a cloud to ground discharge. If the polarity comparator C2 changes state during the 30 microsecond period following trigger T, the classification is set to C, or if S0 shows significant activity relative to a predetermined threshold during the 100 microseconds just preceding trigger T, the classification is also set to C. If neither of the above mentioned C type conditions are fulfilled, then the classification is set to CG.

Figure 3:
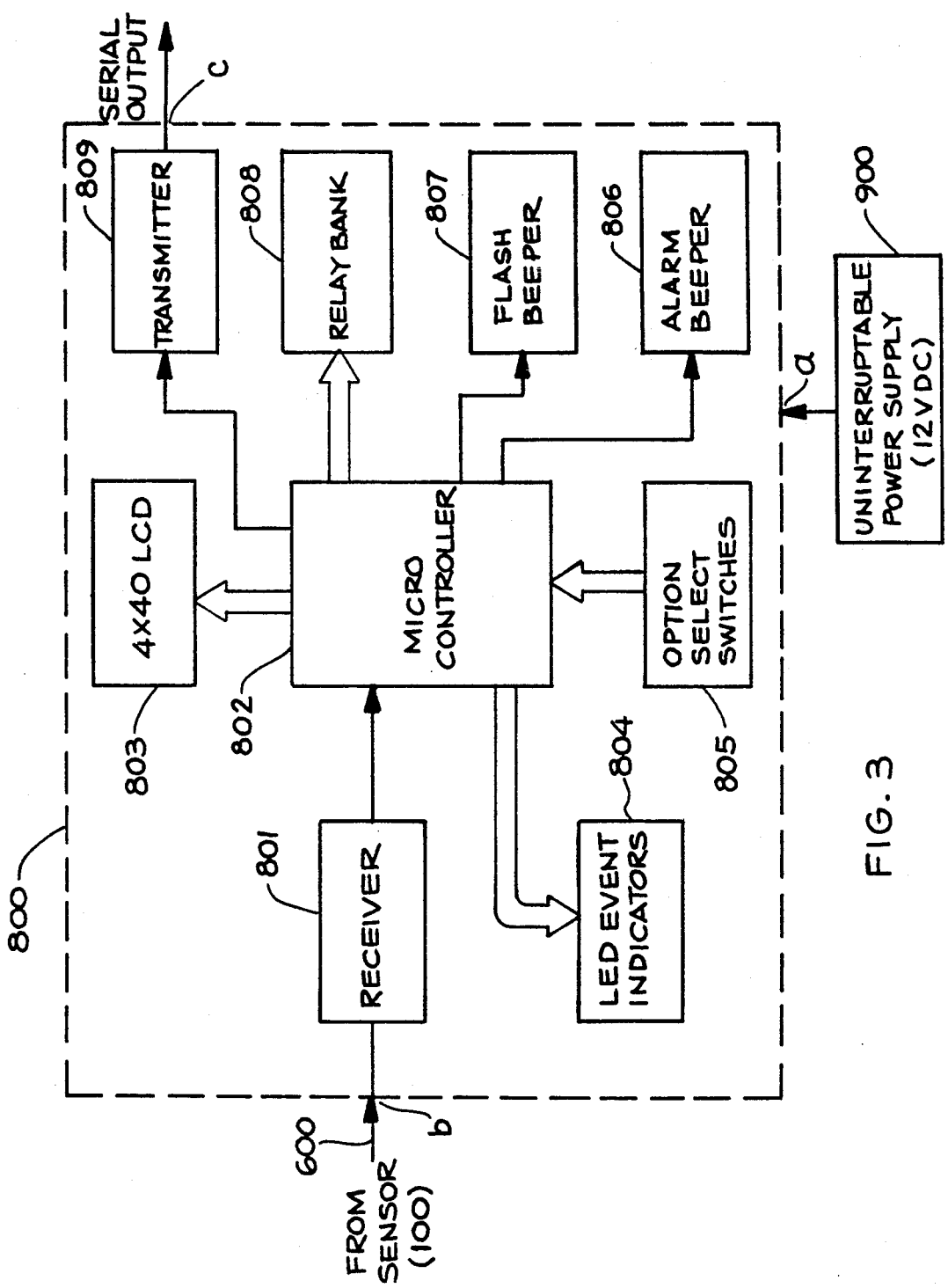
FIG. 3 is a simplified block diagram of the controller depicted in FIG. 2.
Figure 5:
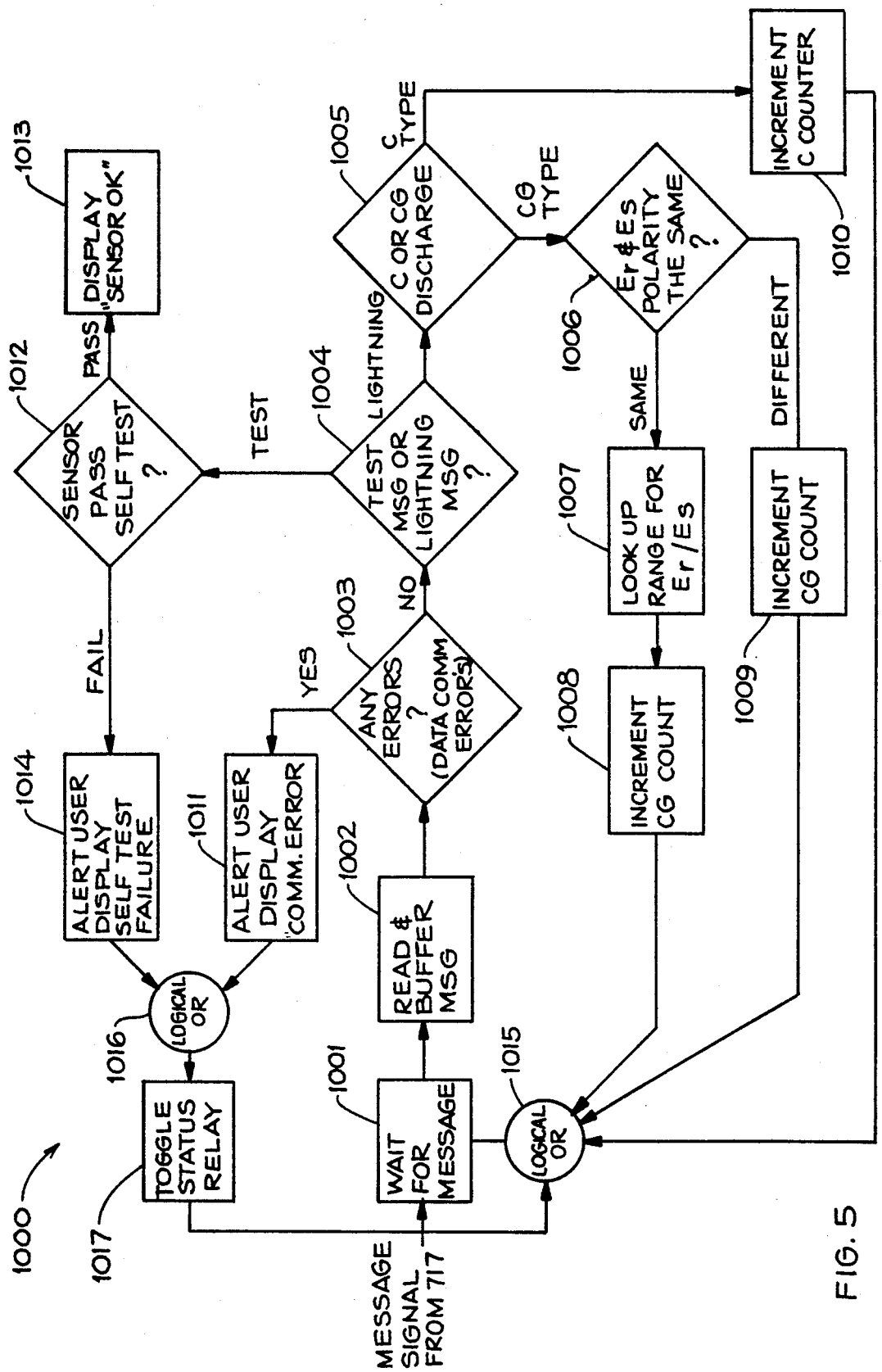
FIG. 5 is an operational flow chart of the controller member.

Once digital information pertaining to Er/Es, Erp, Esp, OVR, TEST, and CLS is formed into a composite encoded message by encoder 319, the message is made available to communication circuit 323 for transmission to the remote controller 800 for further processing and displaying related information about the electrical discharge signal contained in the composite message. FIG. 3 shows a block diagram representation of controller 800, power being provided by example from an uninterruptable power supply 900, and receiving a transmitted message via fiber optic link 600 from sensor 100. Controller 800 comprises a receiver 801 coupled to a central microcomputer 802 for manipulating the received message. The computer algorithm that extracts the contents of the inputted message is depicted in FIG. 5 and is discussed below. The information extracted from the received message can be: (1) selectively controlled by option switches 805, (2) displayed via display 803, (3) displayed according to event class to event indicator 804, (4) retransmitted via transmitter 809, (5) used for controlling relay bank 808, (6) used to provide visual alarm by activating flasher 807 or (7) used for causing an audio alarm by activating beeper 806.

Figure 4:
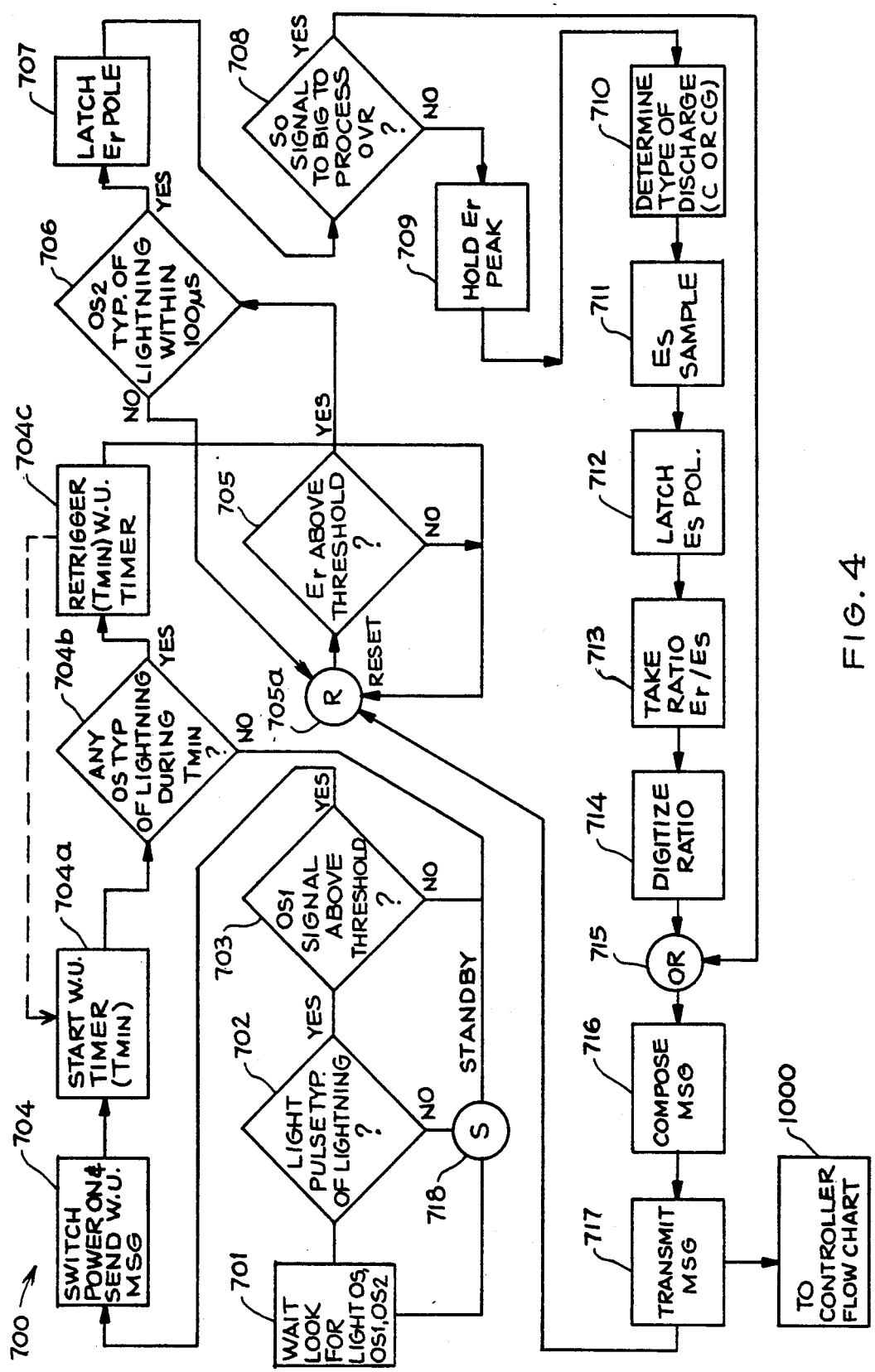
FIG. 4 is an operational flow chart of the sensor apparatus of the present invention.

Referring now to FIG. 4 to summarize the operation of circuit 300. Flow chart 700 depicts the circuit's standby mode in block 701, which upon the occurrence of a light pulse (Os, OS1, OS2), decision block 702 queries whether the light pulse was typical of lightning and, where a no response reverts to standby 718 and where a positive response further queries at 703 whether OS1 is above a threshold, if no the system revert to standby, if positive then the system switches power on at 704 and sends a wake up message to timer 704a to query at 704b if another OS typical of lightning has occurred during Tmin, if no, a standby state results, if yes, Tmin is retriggered at 704c and a reset results at 705a. At this point the query shifts to the electric field and in particular the radiation field component Er at decision block 705 where if not above a predetermined threshold the system is reset and remains in the active power mode. If the radiation field component is above a predetermined threshold, causing the triggering of signal T and a peak Er established after 30 microseconds, another query at block 706 will either cause the circuit 300 to return to the reset mode in the active power state if a light pulse signal OS2 is not received within 100 microseconds of trigger T. If a light pulse is received during the 100 microsecond interval, the polarity latch is set as indicated at block 707, another query at block 708 regarding the amplitude of the signal So is done. If the signal is too large, the information is logically OR'ed at 715 for inclusion as part of the composed message at block 716. If the signal S0 is not too large, then the peak value of Er is established, block 709, the type of lightning discharge is determined at block 710, the low frequency component Es is sampled at block 711, latched at block 712, the ratio of Er/Es is taken and digitized at blocks 713 and 714 and inputted to block 715 for including as part of the message being composed at block 716 for subsequent transmission at block 717 to controller 800 as shown in block 1000.

FIG. 5 shows flow chart 1000 for illustrating the algorithm that is executed by controller 800. The flow of data is by way of block 717 shown in FIG. 4 into an await block 1001 that when data is received the execution of the algorithm commences. Firstly, the data (composite encoded message) is stored for use as indicated in block 1002 for subsequent checking as indicated in decision block 1003. If the data contains errors the user is alerted as indicated at block 1011 for possible resetting to await another message as indicated by path involving logical OR 1016, status toggle 1017, another logical OR 1015 back to await block 1001. If the data is void of errors, the controller then determines if the message is merely a test signal or is in fact regarding a lightning discharge at block 1004. If the message is from a test condition, the integrity of the sensor's function is determined at block 1012. If a test failure is determined, the user is alerted of the test failure, block 1014, for taking appropriate action via path 1016, 1017, 1015. If the sensor passes the integrity check, the result is so indicated, block 1013. If the data concerns an actual lightning, then the system queries at block 1005 as to what type of lightning discharge has occurred, i.e. CG discharge or C discharge (FIG. 5a illustrates further the algorithm executed in circuit 324 for arriving at the particular classification CLS). If the message contains information that the discharge was a C discharge, then a counter is incremented at block 1010 and an await status will follow. If the message contains information that the discharge was a CG discharge, then a query at block 1006 concerning the polarity of Er and Es is conducted. If the polarity of Er and Es is different, then the CG discharge counter is merely incremented, at block 1009. However, if the polarity of Er and Es is the same, then a range of the lightning discharge is determined using the Er/Es ratio content of the encoded composite message, as noted in block 1007, and then the CG discharge counter is incremented, block 1008, followed by waiting for another message.

FIG. 5a is a flow chart 324 of circuit 324 shown in FIG. 2. Using S0 signal information from integrator 306, which is a time domain waveform representation of the electric field change EF received at antenna 502, a query is undertaken at block 324a as to whether the polarity of S0 has changed during a 30 microseconds interval. If the polarity has changed, then the path 324c to 324d is followed to classify So as pertaining to a cloud discharge (C discharge). However, if the polarity of S0 has not changed another query, at block 324b, is conducted regarding whether S0 is above or below a predetermined amplitude threshold value. If the threshold level is exceeded, then the path to block 324d follows to classify the S0 as a C discharge. If the threshold level is not exceeded, then the path to block 324e is followed to classify S0 as a cloud to ground discharge (CG discharge).

Circuit 300's response time to process information about a lightning discharge is in the order of 15 msec. The circuit can respond to repetitive occurrences of flashes of lightning, each typically reoccurring every one second, or to individual return strokes of a flash of lightning, typically reoccurring every 50 msec. Thus, a user can vary the amount of information pertaining to an electrical storm in the vicinity where sensor 100 is placed.

Further, sensor 100 may include being electrically coupled to a bank of relays that control power to sensitive electronic equipment. Referring to FIG. 2, where by example of relay control, circuit 300 interfaces with relay bank 300A, where upon predetermined conditions, regarding the severity and range of an electrical storm, event logic 305, acting as a controller would issue control signals to relay bank 300A that would result in powering down of the associated electronic equipment connected to relays K1 and K2,(equipment not shown).

Therefore, while the present invention has been shown and described herein in what is believed to be the most practical and preferred embodiments, it is recognized that departures can be made therefrom within the scope of the invention, which embodiments are therefore not to be limited to the details disclosed herein, but are to be accorded the full scope of the claims so as to embrace any and all equivalent apparatus.

We claim:

1. An electromagnetic pulse identification and ranging system apparatus, said apparatus comprising:

circuit means having a plurality of circuit portions for manipulating a radiation field component, an electrostatic field component and an optical radiation component of a lightning discharge, and for producing system active and inactive state signals that determine an operational state of said apparatus, a first circuit portion being responsive to an active state signal for generating a composite data signal containing a first set of encoded data pertaining to amplitudes, amplitude ratios and polarities of said radiation field component and said electrostatic field component, and also containing a second set of encoded data identifying said lightning discharge as being one of two types of lightning discharge classifications, a first type being cloud discharge and a second type being cloud-to-ground, and a second circuit portion being responsive to said composite data signal for determining a range of said lightning discharge from said apparatus, for sorting and counting said second set of encoded data relating to said range and to said one of two types of lightning discharge classifications, and for reporting said determined range and sorted classification and, said first circuit portion further comprising an optical sensor circuit means for manipulating said optical radiation component, and wherein said first circuit portion further being responsive to said optical sensor circuit means for producing an inactive state signal that places said apparatus in a standby mode of operation, said standby mode of operation being established after expiration of a predetermined time period without sensing an occurrence of another optical radiation component.

2. An electromagnetic pulse identification and ranging system apparatus as recited in claim 1 wherein:

said lightning discharge being sensed as a first optical signal, and wherein said circuit means produces said active state signal, said circuit means also being activated by an electrical pulse exceeding a predetermined reference amplitude of said radiation field component;

said electrical pulse initiating a signal sampling sequence for sampling said radiation field component for a first predetermined period of time and for sampling said electrostatic field component for a second period of time, said electrical pulse also initiating an optical signal monitoring function for sensing an occurrence of a second optical signal that is typical of lightning during a third predetermined period of time, said occurrance maintains an active state of operation.

3. An electromagnetic pulse identification and ranging system apparatus as recited in claim 2 wherein:

said circuit means includes a discriminator circuit for classifying said lightning discharge as being said one of two types of lightning discharge classifications.

4. An electromagnetic pulse identification and ranging system apparatus, said apparatus comprising:

circuit means having a plurality of circuit portions for manipulating a radiation field component, an electrostatic field component and an optical radiation component of a lightning discharge, and for producing system active and inactive state signals that determine an operational state of said apparatus, a first circuit portion being responsive to an active state signal for generating a composite data signal containing a first set of encoded data pertaining to amplitudes, amplitude ratios and polarities of said radiation field component and said electrostatic field component, and also containing a second set of encoded data for identifying said lightning discharge as being one of two types of lightning discharge classifications, a first type being cloud discharge type and a second type being cloud to ground type, a second circuit portion comprising a discriminator circuit means for generating said second set of encoded data, said discriminator circuit means being responsive to broadband electric field changes generated by said lightning discharge, and a third circuit portion being responsive to said composite data signal for determining a range of said lightning discharge from said apparatus, for sorting and counting said second set of encoded data relating to said range and to said one of two types of lightning discharge classifications, and for reporting said determined range and sorted classification data;

a photovoltaic solar power source means for providing standby mode electrical power and active mode electrical power for said circuit means; and a test circuit means for generating simulated signals representing said optical radiation component, said radiation field component and said electrostatic field component, said simulated signals producing a third set of encoded data contained in said composite data signal.

5. An electromagnetic pulse identification and ranging system apparatus as recited in claim 4, wherein said plurality of circuit portions comprising:

first circuit means for receiving and manipulating said optical radiation component;

second circuit means for receiving and manipulating said radiation field component and said electrostatic field component;

third circuit means for controlling events associated with said first and second circuit means including generating said system active and inactive state signals and controlling said photovoltaic solar power source means;

fourth circuit means responsive to said active state signal for generating a plurality of digital signals that produce said first set of encoded data;

fifth circuit means for generating a classification digital signal that produces said second set of encoded data, said fifth circuit means comprising said discriminator circuit means;

sixth circuit means for encoding said composite data signal composed of said first, second and third sets of encoded data; and said third circuit portion further comprises a seventh circuit means for controlling electrical devices.

6. An electromagnetic pulse identification and ranging system apparatus as recited in claim 5 wherein:
said lightning discharge comprises a flash of light sensed by a provided optical sensor circuit portion of said first circuit means, said flash of light being sensed as said optical radiation component, and wherein said third circuit means produces an inactive state signal that places said apparatus in a standby mode of operation, said standby mode of operation being established after expiration of a predetermined time period without sensing an occurrence of another optical radiation component.

7. An electromagnetic pulse identification and ranging system apparatus, said apparatus comprising:
circuit means having a plurality of circuit portions for manipulating a radiation field component, an electrostatic field component and an optical radiation component of a lightning discharge, and for producing system active and inactive state signals that determine an operation state of said apparatus,
a first circuit portion being responsive to an active state signal for generating a composite data signal containing a first set of encoded data pertaining to amplitudes, amplitude ratios and polarities of said radiation field component and said electrostatic field component, and also containing a second set of encoded data for identifying said lightning discharge as being one of two types of lightning discharge classifications, a first type being cloud discharge type and a second type being cloud to ground type,
a second circuit portion comprising a discriminator circuit means for generating said second set of encoded data, said discriminator circuit means being responsive to broadband electric field changes generated by said lightning discharge, and
a third circuit portion being responsive to said composite data signal for determining a range of said lightning discharge from said apparatus, for sorting and counting said second set of encoded data relating to said range and to said one of two types of lightning discharge classifications, and for reporting said determined range and sorted classification data;
a photovoltaic solar power source means for providing standby mode electrical power and active mode electrical power for said circuit means;
a test circuit means for generating simulated signals representing said optical radiation component, said radiation field component and said electrostatic field component, said simulated signals producing a third set of encoded data contained in said composite and signal; and
said third circuit portion further comprises a remote, fiber optic coupled controller means for performing said tasks of determining a range of said lightning discharge from said apparatus, for sorting and counting said second set of encoded data relating to said range and said one of two types of lightning discharge classifications, and for reporting said determined range, and sorted classification data.

8. An electromagnetic pulse identification and ranging system apparatus as recited in claim 7, wherein said plurality of circuit portions comprising:

first circuit means for receiving and manipulating said optical radiation component;
second circuit means for receiving and manipulating said radiation field component and said electrostatic field component;
third circuit means for controlling events associated with said first and second circuit means including generating said system active and inactive state signals and controlling said photovoltaic solar power source means;
fourth circuit means responsive to said active state signal for generating a plurality of digital signals that produce said first set of encoded data;
fifth circuit means for generating a classification digital signal that produces said second set of encoded data, said fifth circuit means comprising said discriminator circuit means;
sixth circuit means for encoding said composite data signal composed of said first, second and third sets of encoded data; and
seventh circuit means for communicating said composite data signal to said remote controller means for further processing and control.

9. An electromagnetic pulse identification and ranging system apparatus as recited in claim 8 wherein:
said lightning discharge comprises a flash of light sensed by a provided optical sensor circuit portion of said first circuit means, said flash of light being sensed as said optical radiation component, and wherein said third circuit means produces an inactive state signal that places said apparatus in a standby mode of operation, said standby mode of operation being established after expiration of a predetermined time period without sensing an occurrance of another optical radiation component.

10. An electromagnetic pulse identification and ranging system apparatus, said apparatus comprising:
circuit means having a plurality of circuit portions for manipulating a radiation field component, an electrostatic field component and an optical radiation component of a lightning discharge and for producing system active and inactive state signals that determine an operational state of said apparatus,
a first circuit portion being responsive to an active state signal for generating a composite data signal containing a first set of encoded data pertaining to amplitudes, amplitude ratios and polarities of said radiation field component and said electrostatic field component, and also containing a second set of encoded data identifying said lightning discharge as being one of two types of lightning discharge classifications, a first type being cloud discharge type and a second type being cloud-to-ground type, and
a second circuit portion being responsive to said composite data signal or determining a range of said lightning discharge from said apparatus, for sorting and counting said second set of encoded data relating to said range and said one of two types of lightning discharge classifications, and for reporting said determined range and sorted classification data;
a photovoltaic solar power source means for providing standby mode electrical power and active mode electrical power for said circuit means; and
a test circuit means for generating simulated signals representing sad optical radiation component, said radiation field component and said electrostatic field component, said simulated signals producing a third set of encoded data contained in said composite data signal.

11. An electromagnetic pulse identification and ranging system apparatus as recited in claim 10 wherein:
said lightning discharge being sensed as a first optical signal by a provided optical sensor circuit portion of said circuit means;
said circuit means produces said active state of said system state signal;
said circuit means being activated by an electrical pulse exceeding a predetermined reference amplitude of said radiation field component;
said electrical pulse initiating a signal sampling sequence for sampling said radiation field component for a first predetermined period of time and for sampling said electrostatic field component for a second period of time, and
said electrical pulse also initiating an optical signal monitoring function or sensing an occurrence of a second optical signal that is typical of lightning during a third predetermined period of time, said occurrance resulting in maintaining said apparatus in an active state of operation.

12. An electromagnetic pulse identification and ranging system apparatus as recited in claim 11 wherein:
said circuit means includes a discriminator circuit for classifying said lightning discharge as being said one of two types of lightning discharge classification.

13. An electromagnetic pulse identification and ranging system apparatus as recited in claim 10, wherein said plurality of circuit portions comprising:
first circuit means for receiving and manipulating said optical radiation component;
second circuit means for receiving and manipulating said radiation field component and said electrostatic field component;
third circuit means for controlling events associated with said first and second circuit means including generating said system active and inactive state signals and controlling said photovoltaic solar power source means;
fourth circuit means responsive to said active state signal for generating a plurality of digital signals that produce said first set of encoded data;
fifth circuit means for generating a classification digital signal that produces said second set of encoded data;
sixth circuit means for encoding said composite data signal composed of said first, second and third sets of encoded data; and
said second circuit portion further comprises a seventh circuit means for controlling electrical devices.

14. An electromagnetic pulse identification and ranging system apparatus as recited in claim 13 wherein:
said lightning discharge comprises a flash of light sensed by a provided optical sensor circuit portion of said first circuit means, said flash of light being sensed as said optical radiation component, and wherein said third circuit means produces an inactive state signal that places said apparatus in a standby mode of operations, said standby mode of operation being established after expiration of a predetermined time period without sensing an occurance of another optical radiation component.

15. An electromagnetic pulse identification and ranging system apparatus, said apparatus comprising:
circuit means having a plurality of circuit portions for manipulating a radiation field component, an electrostatic field component and an optical radiation component of lightning discharge and for producing system active and inactive state signals that determine an operational state of said apparatus,
a first circuit portion being responsive to an active state signal for generating a composite data signal containing a first set of encoded data pertaining to amplitudes, amplitude ratios and polarities of said radiation field component and said electrostatic field component, and also containing a second set of encoded data identifying said lightning discharge as being one of two types of lightning discharge classifications, a first type being cloud discharge type and a second type being cloud-to-ground type, and
a second circuit portion being responsive to said composite data signal for determining a range of said lightning discharge from said apparatus, for sorting and counting said second set of encoded data relating to said range and said one of two types of lightning discharge classifications, and for reporting said determined range and sorted classification data;
a photovoltaic solar power source means for providing standby mode electrical power and active mode electrical power for said circuit means;
a test circuit means for generating simulated signals representing said optical radiation component, said radiation field component and said electrostatic field component, said simulated signals producing a third set of encoded data contained in said composite data signal; and
said second circuit portion comprises a remote, fiber optic coupler controller means for performing said tasks of determining a range of said lightning discharge from said apparatus, for sorting and counting said second set of encoded data relating to said range and said one of two types of lightning discharge classification and for reporting said determined range, and sorted classification data.

16. An electromagnetic pulse identification and ranging system apparatus as recited in claim 15, wherein said plurality of circuit portions comprising:
first circuit means for receiving and manipulating said optical radiation component;
second circuit means for receiving and manipulating said radiation field component and said electrostatic field component;
third circuit means for controlling events associated with said first and second circuit means including generating said system active and inactive state signals and controlling said photovoltaic solar power source means;
fourth circuit means responsive to said active state signal for generating a plurality of digital signals that produce said first set of encoded data;
fifth circuit means for generating a classification digital signal that produces said second set of encoded data;
sixth circuit means for encoding said composite data signal composed of said first, second and third sets of encoded data; and seventh circuit means for communicating said composite data signal to said remote controller means for further processing and control.

17. An electromagnetic pulse identification and ranging system apparatus as recited in claim 16 wherein:

said lightning discharge comprises a flash of light sensed by a provided optical sensor circuit portion of said first circuit means, said flash of light being sensed as said optical radiation component, and wherein said third circuit means produces an inactive state signal that places said apparatus in a standby mode of operation, said standby mode of operation being established after expiration of a predetermined time period without sensing an occurrance of another optical radiation component.

18. A method of alerting humans about, and protecting equipment against lightning, said method comprising the steps of:

(a) providing a lightning discharge identification and ranging system apparatus, said apparatus comprising:

circuit means having a plurality of circuit portions for manipulating a radiation field component, an electrostatic field component and an optical radiation component of a lightning discharge and for producing system active and inactive state signals that determine an operational state of said apparatus.

a first circuit portion being responsive to an active state signal for generating a composite data signal containing a first set of encoded data pertaining to amplitudes, amplitude ratios and polarities of said radiation field component and said electrostatic field component, and also containing a second set of encoded data identifying said lightning discharge as being one of two types of lightning discharge classifications, a first type being cloud discharge type and a second type being cloud-to-ground type, and a second circuit portion being responsive to said composite data signal for determining a range of said lightning discharge from said apparatus, for sorting and counting said second set of encoded data relating to said range and said one of two types of lightning discharge classifications and for reporting said determined range and sorted classification data;

(b) manipulating said radiation field component, said electrostatic field component and said optical radiation component;

(c) producing an active system state signal;

(d) generating said composite data signal containing said first set of encoded data;

(e) determining said range of said lightning discharge from said apparatus;

(f) sorting and counting said second set of encoded data;

(g) reporting said determined range and sorted classification data.

* * * * *